(12) United States Patent
Huang

(10) Patent No.: US 7,071,102 B2
(45) Date of Patent: Jul. 4, 2006

(54) METHOD OF FORMING A METAL SILICIDE LAYER ON NON-PLANAR-TOPOGRAPHY POLYSILICON

(75) Inventor: Chi-Tung Huang, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/752,276

(22) Filed: Jan. 6, 2004

(65) Prior Publication Data

US 2005/0146036 A1 Jul. 7, 2005

(51) Int. Cl.
*H01L 21/4763* (2006.01)
(52) U.S. Cl. ...................... 438/649; 438/683
(58) Field of Classification Search ............. 438/682, 438/683, 684, 649
See application file for complete search history.

(56) References Cited

U.S. PATENT DOCUMENTS

| 5,913,145 | A | * | 6/1999 | Lu et al. ................. 438/643 |
| 5,998,294 | A | * | 12/1999 | Clayton et al. ........... 438/659 |
| 6,524,952 | B1 | * | 2/2003 | Srinivas et al. ........... 438/649 |
| 6,528,421 | B1 | * | 3/2003 | Yang ...................... 438/682 |
| 2003/0022487 | A1 | * | 1/2003 | Yoon et al. .............. 438/642 |
| 2003/0054637 | A1 | * | 3/2003 | Yang ...................... 438/682 |

* cited by examiner

*Primary Examiner*—Tuan H. Nguyen
(74) *Attorney, Agent, or Firm*—Stout, Uxa, Buyan & Mullins, LLP

(57) ABSTRACT

A process is described for creating a uniformly thick layer of titanium, cobalt, or nickel silicide over a layer of polysilicon that has features or a non-planar topography. A dual layer of metal is deposited onto patterned polysilicon such that the first layer covers the bottoms and tops of the non-planar topography and the second layer covers the sidewalls and tops of the non-planar topography. By heating the metal, etching away any un-reacted metal, and heating the result a second time, a metal silicide layer of uniform thickness, reduced stress and reduced resistivity is formed.

20 Claims, 4 Drawing Sheets

METHOD OF FORMING A METAL SILICIDE LAYER ON NON-PLANAR-TOPOGRAPHY POLYSILICON

BACKGROUND OF THE INVENTION

1. Field of the Invention

The present invention relates generally to semiconductor processing and, more particularly, to the formation of a metal silicide layers.

2. Description of Related Art

A known method of forming a metal silicide layer on polysilicon comprises depositing a metal layer on the polysilicon, performing a first rapid thermal processing (RTP) step, performing a wet etch, and then performing a second RTP step.

When a layer of polysilicon has a non-planar topography, using conventional physical vapor deposition (PVD) to deposit the metal layer can result in poor bottom coverage, meaning that either the metal layer is not deposited onto the low points of the topography or the metal layer that may exist at those low points is thin compared to the metal layer deposited onto the higher points of the topography. Likewise, to the extent a metal deposition process were to be accomplished through ionized metal plasma physical vapor deposition (IMP PVD) with a biased wafer chuck, the bottom coverage may be exceptional, but the sidewall coverage may be poor.

A need thus exists in the prior art to deposit a metal silicide layer onto patterned polysilicon such that the metal silicide thickness is relatively uniform over the tops, sides, and bottoms of the non-planar topography polysilicon. A relatively uniform metal silicide layer over non-planar topography polysilicon may be desired to provide, for example, enhanced device performance and reliability.

SUMMARY OF THE INVENTION

Briefly, various methods can facilitate the formation of a metal silicide layer on polysilicon, wherein the polysilicon has a non-planar topography including, for example, features. Initially, non-planar topography polysilicon is formed on a substrate. A metal layer is then deposited on the substrate using a plurality of metal depositions. A first rapid thermal processing (RTP) step then forms a silicide layer at an interface between the metal layer and the non-planar topography polysilicon. The formation of this silicide layer occurs during the first RTP step as a result of the transformation of a reactive part of the metal layer (i.e., a portion of the metal layer that is in physical contact with the polysilicon) into silicide. After the first RTP step, a wet etch, such as a selective wet etch, removes an un-reactive part of the metal layer. A second RTP step is then implemented to reduce a stress and resistance of the silicide layer.

The present invention addresses the need for a uniform metal silicide layer over the non-planar or featured polysilicon topography by implementing two metal deposition steps, wherein one of the metal deposition steps provides improved bottom coverage and the other metal deposition step provides improved sidewall coverage. The present invention further addresses the need for an improved metal silicide layer over non-planar topography polysilicon by providing a metal silicide layer over non-planar topography polysilicon with relatively uniform and relatively complete coverage. Two methods are illustrated, each of which includes forming a metal silicide layer by a multiple-step metal deposition. In particular, each method includes multiple steps, at least two of which are metal deposition steps. In the illustrated methods, one metal deposition step uses an improved bottom coverage process and the other metal deposition step uses an improved sidewall coverage process. Thus, the disclosed methods for forming a metal silicide layer on non-planar topography polysilicon involve forming the metal layer using at least one of a metal deposition step having improved bottom coverage and a metal deposition step having improved sidewall coverage.

In accordance with one aspect of the present invention, a method for forming a semiconductor device comprises forming on a substrate a polysilicon layer having a non-planar topography; forming a first metal layer on the non-planar topography polysilicon layer; forming a second metal layer on the non-planar topography polysilicon layer, the second metal layer having one of (a) a sidewall coverage that is greater than a sidewall coverage of the first metal layer and (b) a bottom coverage that is greater than a bottom coverage of the first layer; and performing thermal processing to generate a metal silicide layer. Devices made using this method are also included.

According to another aspect of the present invention, a method for forming a semiconductor device comprises forming a featured polysilicon layer on a substrate; forming a first metal layer on the featured polysilicon layer, the first metal layer covering lateral surfaces of the featured polysilicon layer to a greater extent than vertical surfaces; forming a second metal layer over the featured polysilicon layer, the second metal layer covering vertical surfaces of the featured polysilicon layer to a greater extent than a coverage of vertical surfaces by the first metal layer; and performing thermal processing to generate a metal silicide layer. Also disclosed are devices which are made using this method.

In yet another aspect of the present invention, a method for forming a semiconductor device comprises forming a featured polysilicon layer on a substrate; forming a first metal layer on the featured polysilicon layer; performing thermal processing to generate a first metal silicide layer within the first metal layer, the first metal silicide layer having a greater bottom coverage than a sidewall coverage; forming a second metal layer over the featured polysilicon layer; and performing thermal processing to generate a second metal silicide layer, which has a greater sidewall coverage than a sidewall coverage of the first metal silicide layer. Devices made using this method are disclosed.

Another aspect of the present invention comprises a method for forming a semiconductor device that includes forming on a substrate a polysilicon layer having a non-planar topography; forming a first metal layer on the non-planar topography polysilicon, the forming of the first metal layer including directing metal particles toward the non-planar topography polysilicon layer at a first angle of incidence; forming a second metal layer over the non-planar topography polysilicon layer, the forming of the second metal layer including directing metal particles toward the non-planar topography polysilicon at a second angle of incidence, which is not equal to the first angle of incidence; and performing thermal processing to generate a metal silicide layer. Also disclosed are structures formed using this method.

Any feature or combination of features described herein are included within the scope of the present invention provided that the features included in any such combination are not mutually inconsistent as will be apparent from the context, this specification, and the knowledge of one of ordinary skill in the art. For purposes of summarizing the present invention, certain aspects, advantages and novel features of the present invention have been described herein. Of course, it is to be understood that not necessarily all such aspects, advantages or features will be embodied in any particular embodiment of the present invention. Additional advantages and aspects of the present invention are apparent in the following detailed description and claims.

DETAILED DESCRIPTION OF THE PRESENTLY PREFERRED EMBODIMENTS

Figure 1:
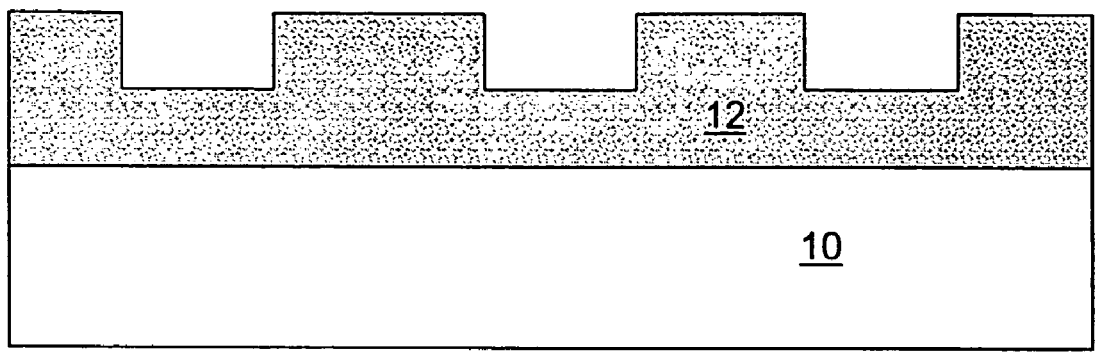
FIG. 1 is a schematic diagram of a semiconductor profile depicting a layer of non-planar topography polysilicon resulting from a non-planar topography polysilicon deposition step in a semiconductor process, in accordance with both a first illustrated embodiment and a second illustrated embodiment of the present invention.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the process steps and structures described herein do not cover a complete process flow for the manufacture of semiconductor devices. The present invention may be practiced in conjunction with various semiconductor processing techniques that are conventionally used in the art, and only so much of the commonly practiced process steps are included herein as are necessary to provide an understanding of the present invention. The present invention has applicability in the field of semiconductor processes in general. For illustrative purposes, however, the following description pertains to a specific semiconductor device and a method of making and using the same.

The metal silicide layers of the present invention can be employed over non-planar or featured polysilicon surfaces in the fabrication of, for example, MOSFET electrodes. Before the polysilicon is deposited, a substrate can be covered with an oxide layer, and doped to form regions of p-type conductivity and n-type conductivity. The oxide layer can then be patterned, leaving regions of oxide including a gate oxide.

Polysilicon Deposition

Polysilicon is deposited by a polysilicon deposition process that produces a film of polysilicon. The polysilicon adheres well to the oxide layer, e.g., gate oxide. The polysilicon by itself does not conduct electricity well, but if the polysilicon is heavily doped with boron, phosphorus or arsenic, for example, its resistivity can be reduced significantly. Typically, doping is achieved by ion implantation after the film is deposited, or by introduction of dopant gases into the polysilicon deposition process itself.

FIG. 1 shows non-planar topography polysilicon 12 formed on a substrate 12. As used herein, the term "non-planar topography polysilicon" refers to polysilicon having a non-planar topography wherein a thickness thereof varies significantly, usually in discrete steps of considerable depth. Polysilicon consists of many small single crystal grains that are separated by grain boundaries, a state otherwise known as polycrystalline. Upon initial deposition, polysilicon may be either polycrystalline or amorphous. An amorphous film can become polycrystalline, however, under high temperatures. Exemplary methods of forming non-planar topography polysilicon 12 include low-pressure chemical vapor deposition (LPCVD) or plasma-enhanced chemical vapor deposition (PECVD) for a deposition and an anisotropic etch to acquire a non-planar topography. Each of the polysilicon deposition processes can employ silane ($SiH_4$) as the polysilicon source material.

A plurality of wafers may be processed together as a group, i.e. "in batch." LPCVD deposits polysilicon thermally in batch at relatively high temperatures of, for example, 600° C. to 700° C. with wafers vertically stacked. PECVD involves the use of plasma to extract the reactive species of polysilicon from silane and to deposit the polysilicon onto the wafer. PECVD has the advantage of being able to deposit polysilicon at relatively low temperatures of, for example, 250° C. to 450° C.

The anisotropic etch consists of a series of photolithography and dry etch steps. As used herein, the term "anisotropic" refers to an etching process which occurs, for example, only in a vertical direction with respect to the surface of the wafer. As used herein, the term "photolithography" refers to the use of light to transfer an image from one medium to another. The original image is patterned onto, for example, a reticle, having the pattern for one integrated circuit (IC) or a few IC's, or onto a photomask, having the pattern for all of the IC's on a wafer. The image is transferred to a photoresist that is applied to the wafer. The etch process can vary significantly in many ways, but the primary steps typically can be as follows: 1) wafers are cleaned and primed, 2) photoresist is applied to the wafers, 3) the photoresist is dried and cured, 4) the wafers are aligned with the reticle or photomask and the photoresist undergoes exposure to light, 5) the photoresist is developed, 6) the developed patterns on the photoresist are inspected, 7) the photoresist is hard baked, 8) a non-planar or featured topography is etched into the polysilicon, 9) the polysilicon etch is inspected, and 10) the photoresist is removed and the wafer is cleaned.

The non-planar topography polysilicon 12 of FIG. 1 may be formed in accordance with any of these or other conventional methods.

First Metal Deposition

Metal layer deposition in accordance with the illustrated embodiment can be accomplished, for example, by sputtering, otherwise known as physical vapor deposition (PVD). PVD involves bombarding a metal target with, for example, ionized argon. This physical bombardment causes atoms of the metal target to be deposited onto the wafer. This process by itself will scatter the metal atoms in many directions, resulting in a relatively uniform deposition over a flat surface.

A collimator may be employed to direct the metal atoms along paths more perpendicular to the wafer. Many collimators consist of structures that look like thick honeycombs. The collimator is placed between the metal target and the wafer. The use of a collimator in PVD is often referred to as collimated deposition (also known as CD, but not to be confused with the term "critical dimension"). As used herein, the term "collimated deposition" (CD) is a process involving the use of a collimator in, for example, a conventional PVD process chamber. Only certain metal atoms that leave the metal target are allowed to pass through the collimator. The collimated deposition can improve the bottom coverage because the atoms from the metal target are directed along paths that are more perpendicular to the wafer than with the absence of the collimator. Uncollimated deposition, in contrast, is often referred to as conventional PVD.

In accordance with an aspect of the present invention, however, a process called ionized metal plasma physical vapor deposition (IMP PVD) can be implemented as a robust method of achieving more perpendicular paths for the metal atoms than CD. This need is especially important as aspect ratios are increasing with decreasing device geometries. The "aspect ratio" is the depth of the feature that is being filled divided by its width; a feature with a high aspect ratio implies that the feature is a narrow, deep hole.

In IMP PVD, the atoms are sputtered from the metal target into high-density plasma. First the metal atoms are sputtered from the target with argon much like conventional PVD. In this case, however, the ejected metal atoms slow down due to collisions with higher concentrations of argon. The slower metal atoms move into the plasma created by an inductively coupled plasma (ICP) source and become ionized by the electrons in the plasma. Between the bottom portion of the plasma and the wafer is a space called the plasma sheath. The plasma sheath has a very high electric field that directs the metal ions to the surface of the wafer.

Applying a capacitively coupled voltage to the wafer chuck controls this electric field. This voltage is usually referred to as the bias, but is typically applied at radio frequency (RF) AC rather than DC. The plasma sheath in IMP PVD plays a similar role as the less effective collimator in conventional PVD in that the metal atoms are delivered to the wafer along nearly perpendicular paths. This allows the bottoms and tops of steep topography to be filled with relative ease.

Figure 2:
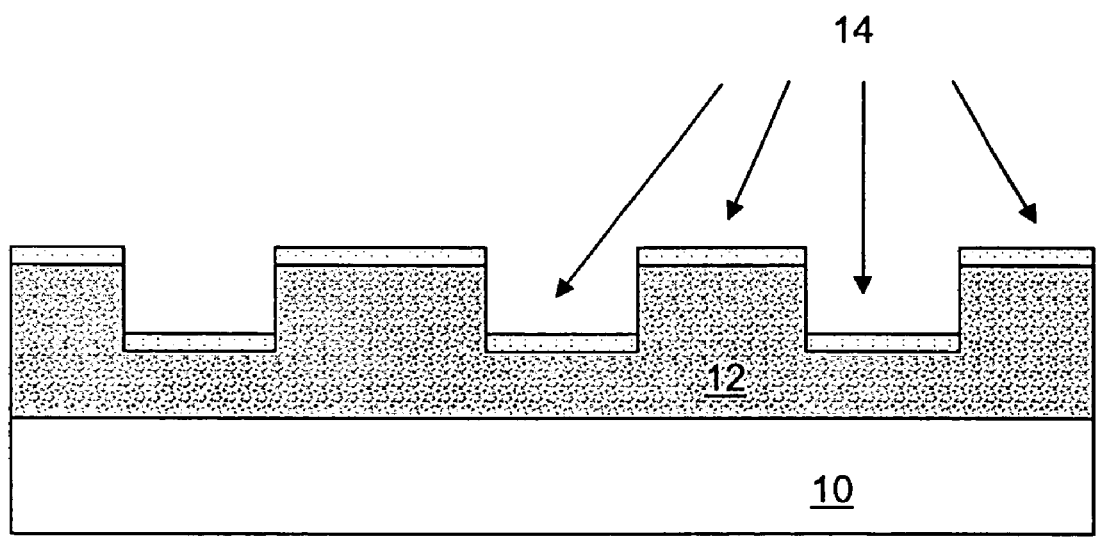
FIG. 2 is a schematic diagram of a semiconductor profile depicting a first metal layer disposed over the non-planar topography polysilicon resulting from a first metal deposition step in a semiconductor process wherein the first metal layer has been deposited via biased ionized metal plasma physical vapor deposition or collimated deposition, in accordance with the first illustrated embodiment of the present invention.

In accordance with the illustrated embodiment shown in FIG. 2, a first metal layer 14 is formed on the substrate 10 by an improved bottom coverage process wherein the process comprises biased IMP deposition or collimated deposition (CD). The IMP deposition is a biased ionized metal plasma deposition in that there is a voltage applied to the wafer chuck. The bias voltage effectively increases the electric field between the bottom of the plasma and the wafer. This increased electric field can improve the bottom coverage because the metal ions from the plasma are directed along paths that are more perpendicular to the wafer than in the absence of the field.

The metal is chosen such that a metal silicide of the metal is stable at subsequent high process temperatures and is as immune to electromigration as possible. Electromigration occurs when the movement of electrons in a conductor is sufficient to move the atoms of the metal itself. Electromigration is more likely to occur at high operating temperatures and high current densities. The displacement of the atoms in the metal layer can eventually lead to a short circuit. As device geometries decrease in size, the possibility of electromigration can commensurately increase.

As presently embodied, the first metal layer 14 can comprise, for example, titanium (Ti), Cobalt (Co), Nickel (Ni), or alloys thereof. In the illustrated embodiment, the metals Ti, Co, or Ni are chosen as the first metal layer, rather than other metals such as aluminum, gold, silver, chromium, molybdenum, tungsten, platinum, palladium, etc., as a result of it having been determined that metal silicides of Ti, Co, and Ni form relatively easily over polysilicon, have thermally stable structures when formed, have lower contact resistivities, and tend to migrate less within the device. Owing at least in part to various integration issues on ICs with smaller geometries, a selection of Co over Ti may be preferred, and ultimately, selections of Ni over Co may further be preferred.

Because the paths of the metal ions/atoms reach the wafer with nearly 90° trajectories with the substrate, in accordance with an aspect of the present invention, IMP or CD can be used to effectively deposit a metal layer on the tops and bottoms of non-planar topography polysilicon 12. In modified embodiments, chemical vapor deposition (CVD) processes may be used.

Second Metal Deposition

Figure 3:
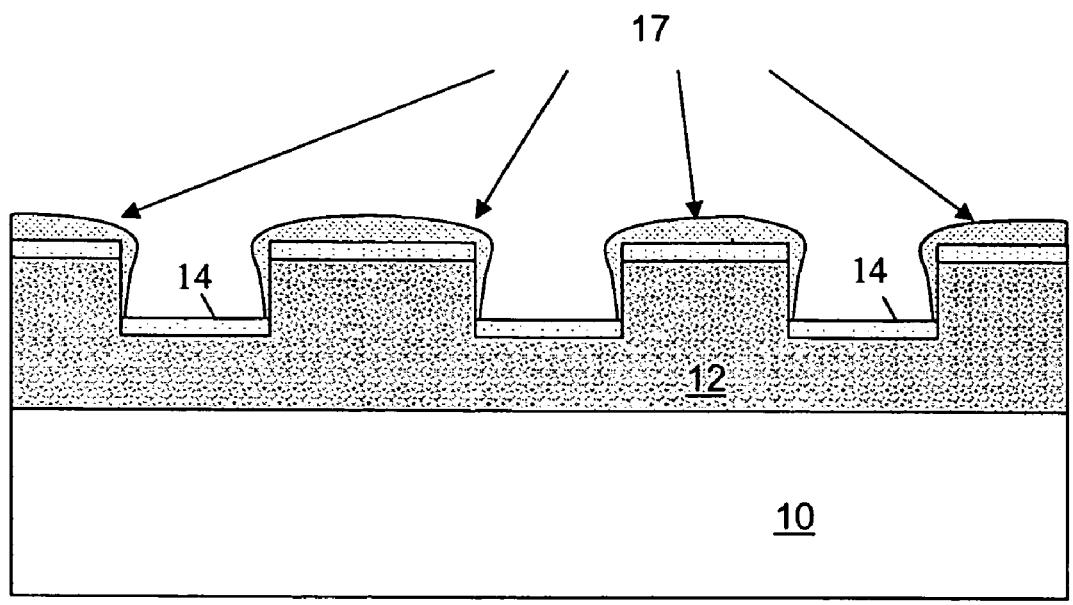
FIG. 3 is a schematic diagram of a semiconductor profile depicting a second metal layer disposed over the first metal layer from a second deposition step in a semiconductor process wherein the second metal layer has been deposited via unbiased ionized metal plasma physical vapor deposition or conventional physical vapor deposition, in accordance with the first illustrated embodiment of the present invention.

After the first metal deposition step, a second metal deposition is performed. The schematic diagram of a semiconductor profile in FIG. 3 depicts a step of a semiconductor process, in accordance with this illustrated embodiment of the present invention, wherein a second metal layer 17 is formed on the substrate 10 by an improved sidewall coverage process, wherein the process comprises, for example, unbiased IMP deposition or conventional PVD. As presently embodied, the second metal layer 17 can comprise, for example, titanium, (Ti), cobalt (Co), nickel (Ni), or alloys thereof.

The IMP deposition is an unbiased ionized metal plasma deposition in that, for example, there is no voltage applied to the wafer chuck. Having no bias can allow many of the metal ions to reach the wafer at more oblique angles than with the presence of a bias voltage. The unbiased IMP can improve the sidewall coverage process since the paths of metal ions can allow them to reach the sides of the non-planar topography.

Conventional PVD is a process that involves a sputtering of atoms from a metal target without the use of a collimator or plasma. Without a collimator the metal atoms that are ejected from the target can travel in various directions. Many of these atoms reach the wafer at oblique angles to the substrate. Conventional PVD can thus improve the sidewall coverage process since the paths of metal atoms can allow them to reach vertical surfaces of the non-planar topography.

A result of employing the bottom coverage process followed by the sidewall coverage process in accordance with the present invention can comprise metal film coverage over all of the features of the non-planar topography polysilicon as shown in FIG. 3. If desired, according to modified embodiments, a CVD process may be implemented. If desired, the second metal layer 17 may be implemented to increase the overall quantity of metal within the semiconductor device. For example, extremely small capacitors may be implemented by creating metallic sidewall coverage with little or no bottom coverage in trench features of the non-planar topography that are subsequently filled with a dielectric material (or left empty). The second metal is deposited to a much lesser extent on the bottom surfaces.

First RTP: Metal Silicide Formation

Figure 4:
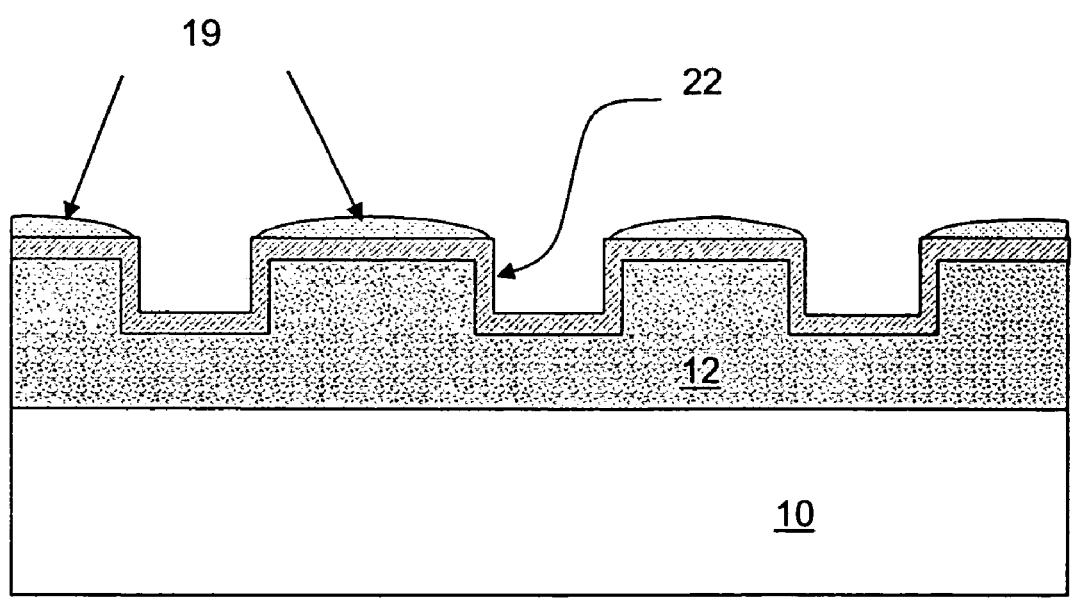
FIG. 4 is a schematic diagram of a semiconductor profile depicting a resulting structure following a first rapid thermal processing step in a semiconductor process wherein a metal silicide layer is formed on top of the non-planar topography polysilicon, in accordance with the first illustrated embodiment of the present invention.

After the second metal layer 17 is deposited (FIG. 3), the wafer goes through a thermal treatment to convert a portion of the metal layer to a metal silicide layer, wherein as presently embodied a top portion of the metal layer remains intact. In the embodiment illustrated in FIG. 4, this thermal treatment comprises a first rapid thermal processing (RTP) step, which yields a first metal silicide layer disposed under a remaining part of the metal layer. More particularly, following deposition of the metal layer on the polysilicon, the RTP step can allow atoms from the polysilicon below to diffuse into the metal layer above and/or atoms from the metal layer above to diffuse into the polysilicon below. The first RTP step, which may also be referred to as an annealing step, or a first RTA step, results in the formation a metal silicide layer 22 and a residual portion of un-reactive metal layer 19.

As a result of, for example, the formation of metal silicide often being highly dependent upon temperature, an embodiment of the present invention can comprise single wafer RTP equipment as distinguished from conventional batch furnaces. In such implementations, separate banks of lamps at various radii in an RTP chamber can facilitate precise control in temperature cycling. This temperature control can change the temperature within different portions of the wafer and this temperature profile can be highly repeatable from wafer to wafer. Thus, in accordance with an aspect of the present invention, RTP can provide a convenient method to complete the presently described processes while attenuating or eliminating side effects which may be associated with having too much heat.

Wet Etch

Figure 5:
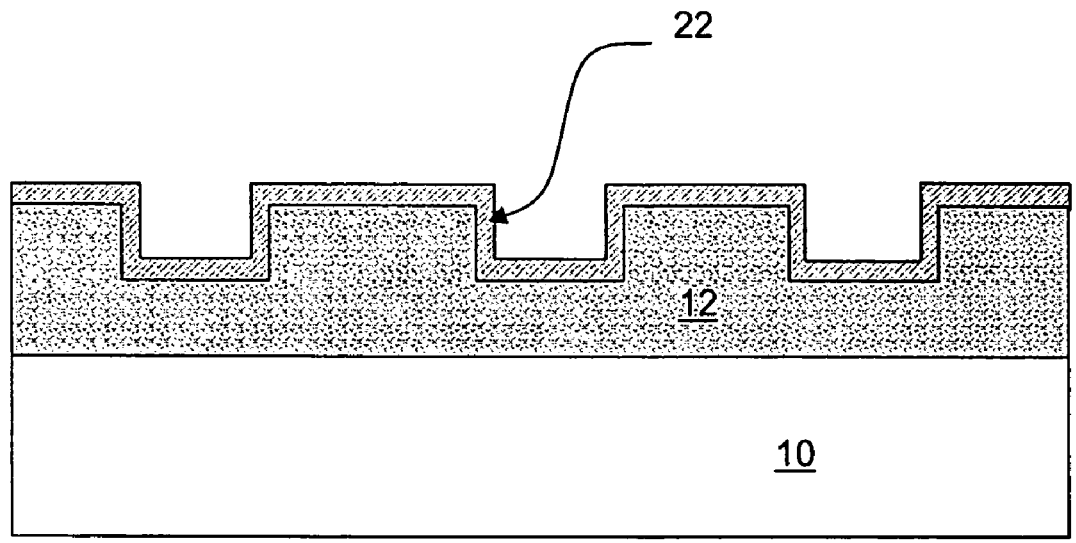
FIG. 5 is a schematic diagram of a semiconductor profile depicting a structure of the present invention following a wet etch step and a second rapid thermal processing step.

Since in the illustrated embodiment the polysilicon atoms do not diffuse completely to the top surface of the metal layer, an etching step can be required to remove the top layer of un-reactive metal 19 that does not have the polysilicon within it. FIG. 5 is a schematic diagram of a semiconductor profile depicting a step in a semiconductor process, in accordance with this illustrated embodiment of the present invention, wherein a selective wet etching has been performed to remove the un-reactive metal layer 19. In accordance with the illustrated wet etching technique, the material that is not desired is chemically removed by spraying the etching chemical onto the wafers or, more commonly, dunking an entire boat of wafers into a vat of the etching chemical. The wet etching is selective when the desired material is removed faster than any adjacent material. In the present case the ingredients of the wet etch chemistry are chosen to be selective to the metal versus the metal silicide. As presently embodied, the selectivity for the metal versus the metal silicide should be within a range of about 100:1 to about 200:1. An example of a suitable etchant is NH4OH/H2O2/H2O+HCL/H2O2/H2O, which in an embodiment wherein the metal layer is made of cobalt has a selectivity for the metal over the metal silicide of 100:1

Following removal of the un-reactive metal layer 19 with the wet etch step, the underlying metal silicide layer 22 will remain and be exposed to any subsequent process steps. The surface of this metal silicide layer 22, however, can be porous due to the removal of interstitial metal atoms that were present before the wet etching. This porosity and the irregular structure of metal and polysilicon atoms in the metal silicide layer 22 can cause the resistivity of the metal silicide layer 22 to be relatively high.

Second RTP

Generally, the metal silicide layer is formed over the polysilicon to lower the overall resistivity of an electrode and to provide a glue-like layer between the polysilicon below and a metal layer above (e.g., aluminum or tungsten). The metal silicide layer thus can facilitate coupling of metal to the polysilicon, thereby allowing contacts to be formed between metals (such as wires) and the polysilicon itself.

In the illustrated embodiment, a second rapid thermal processing (RTP) step is conducted to form the metal silicide layer 22 into a second metal silicide layer. The second RTP step can condense the metal silicide layer 22 so that structural irregularities resulting from the diffusion or the wet etch can be attenuated or eliminated. This process can reduce stress, such as the intrinsic stress, of the metal silicide layer 22 on the non-planar topography polysilicon 12. Moreover, the more regularly arranged atoms can reduce the resistivity of the metal silicide layer 22.

Regarding a purpose of the second RTP step to relax the stress of the metal silicide layer 22 relative to the non-planar topography polysilicon 12 beneath it, in the process of making the metal silicide layer 22 two sources of stress can be present. One is an intrinsic stress that arises from having polysilicon atoms diffuse into the metal layer. The intrinsic stress can be compressive because more atoms are being packed into the same volume as that of the originally deposited metal layer. Compressive stress means that the metal silicide layer pulls on the non-planar topography polysilicon 12 beneath it from the edge of the wafer to the center. The second stress can arise from a difference between the thermal expansion coefficients of polysilicon and the metal silicide. The thermal stress of the metal silicide layer can be "tensile" with respect to the non-planar topography polysilicon 12, meaning that the metal silicide layer 22 can push the non-planar topography polysilicon 12 beneath it outward from the center to the edge of the wafer. The intrinsic stress may tend to be greater than the thermal stress for this process. Highly stressed films generally may be more likely to corrode and not adhere to the surface beneath them.

In connection with reducing a resistivity of the metal silicide layer 22, it can be desirable to reduce the resistance of the metal silicide layer 22 since the material can correspond to the transistor electrodes. A higher conductivity of the transistor electrodes, which can be introduced by performance of the second RTP, can, for example, allow the device to switch faster. Thus, a final result following the second RTP can be a uniformly thick metal silicide layer 22, relatively uniformly covering the non-planar topography polysilicon 12, with relatively low stress and relatively low resistivity.

The Two RTP Steps

As presently embodied, the resulting metal silicide layer has a structural strength which can be greater than the structural strength of polysilicon and which can be more rigid than polysilicon. Adding additional metal silicide to the sidewalls can provide additional structural strength to thereby reduce stress on the polysilicon by, for example, holding it in place. As subsequent layers are deposited onto the device during the manufacturing process, and as subsequent thermal steps cause flexing of the semiconductor device as various layers with differing thermal coefficients of expansion stress the semiconductor device, the additional metal silicide layer can help to hold the device rigidly and to reduce the amount of stress applied to the other layers.

Second Embodiment: Unbiased IMP or PVD, and then Biased IMP or CD

In a second embodiment, the order of the two metal depositions described in the first embodiment is changed. According to one embodiment, the order of the two metal deposition process steps is the only difference between the second illustrated embodiment and the first illustrated embodiment. Hence, in a first step in a semiconductor process, non-planar topography or featured polysilicon is formed on a substrate.

Figure 6:
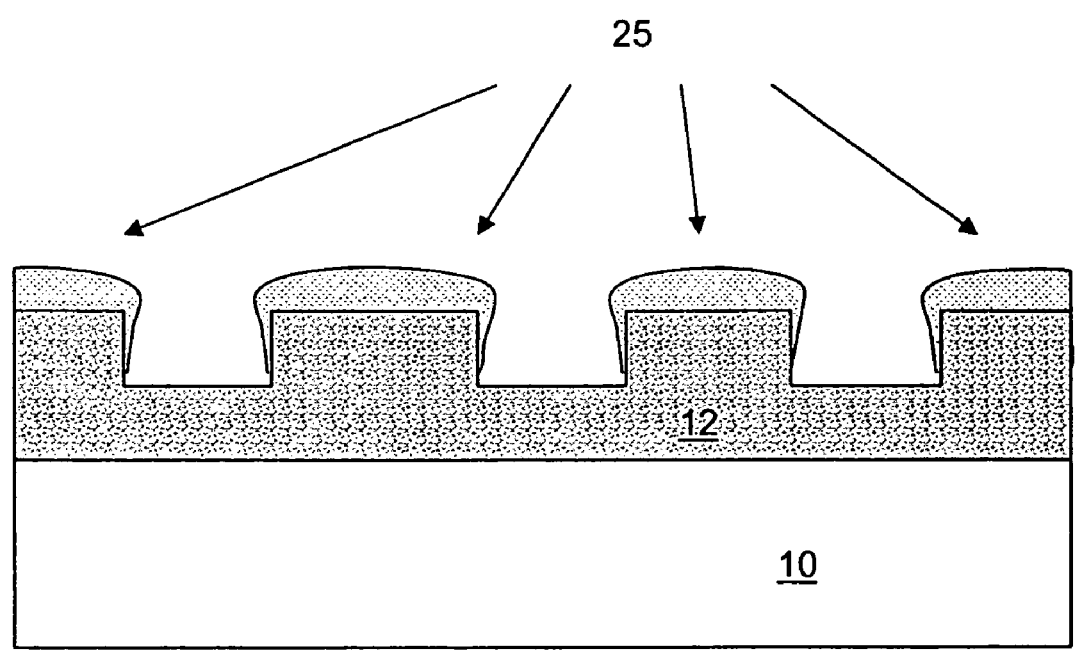
FIG. 6 is a schematic diagram of a semiconductor profile depicting non-planar topography polysilicon with a first metal layer that has been deposited thereon via unbiased ionized metal plasma physical vapor deposition or conventional physical vapor deposition, in accordance with the second illustrated embodiment of the present invention.

In a subsequent step in the semiconductor process, a first metal layer is formed on the substrate by an improving sidewall coverage process. FIG. 6 is a schematic diagram of a semiconductor profile depicting a step in a semiconductor process, in accordance with this second illustrated embodiment of the present invention, wherein the first metal layer 25 is deposited onto the top, the sides and slightly on the bottom of the non-planar topography polysilicon 12. The first metal layer 25 is formed, for example, by either unbiased IMP deposition or conventional PVD. The first metal layer 25 comprises, for example, Ti, Co, or Ni, or alloys thereof.

Figure 7:
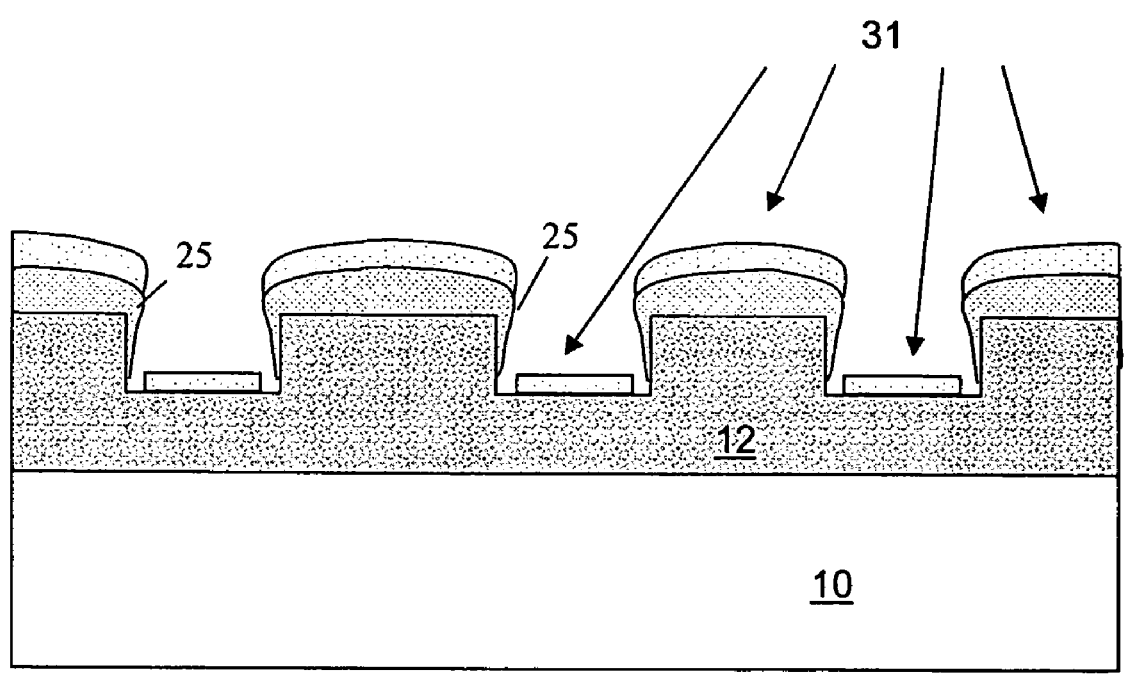
FIG. 7 is a schematic diagram of a semiconductor profile depicting non-planar topography polysilicon with a second metal layer that has been deposited via biased ionized metal plasma physical vapor deposition or collimated deposition, in accordance with the second illustrated embodiment of the present invention.

In a following step in the semiconductor process, a second metal layer 31, comprising, for example, the same metal as the first layer, is formed by either biased IMP or collimated deposition (CD). FIG. 7 is a schematic diagram of a semiconductor profile depicting a step in a semiconductor process, in accordance with this illustrated embodiment of the present invention, wherein the second metal layer 31 is deposited for bottom coverage of the non-planar topography polysilicon 12. Another step comprises the first RTP process, followed by a step comprising a wet etching process, followed by a step comprising the second RTP process, to thereby yield a construction similar to that depicted in FIG. 6.

On features of non-planar topography polysilicon 12 having relatively large aspect ratios, the metal layer from the first deposition step may block some of the metal atoms that would otherwise be deposited on the bottom of the non-planar topography polysilicon during the second deposition step. This may result in a metal layer over non-planar topography polysilicon 12 with incomplete bottom coverage. Incomplete bottom coverage can be avoided by carefully tuning and/or monitoring the deposition process, and also by tuning the RTP steps.

In view of the foregoing, it will be understood by those skilled in the art that the methods of the present invention can facilitate formation of improved semiconductor devices, and in particular formation of metal silicide layers having improved bottom coverage and/or improved sidewall coverage. The above-described embodiments have been provided by way of example, and the present invention is not limited to these examples. Multiple variations and modification to the disclosed embodiments will occur, to the extent not mutually exclusive, to those skilled in the art upon consideration of the foregoing description. The metal silicide layers of the present invention can have applicability in the fabrication of, for example, mask read-only memory (ROM) devices, flash memories including electrically programmable read-only memory (EPROM) devices, dynamic random access memory (DRAM) devices, and others. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A method for forming a semiconductor device, comprising:
   forming on a substrate a polysilicon layer having a non-planar topography;
   directing particles at a first angle of incidence and forming a first metal layer on the non-planar topography polysilicon layer;
   directing particles at another angle of incidence different from the first angle and forming a second metal layer on the non-planar topography polysilicon layer, the second metal layer having one of (a) a sidewall coverage that is greater than a sidewall coverage of the first metal layer and (b) a bottom coverage that is greater than a bottom coverage of the first metal layer; and
   performing thermal processing to generate a metal silicide layer.

2. The method for forming a semiconductor device as set forth in claim 1, wherein the second metal layer has a bottom coverage that is greater than a bottom coverage of the first metal layer.

3. The method for forming a semiconductor device as set forth in claim 1, wherein the second metal layer has a sidewall coverage that is greater than a sidewall coverage of the first metal layer.

4. The method for forming a semiconductor device as set forth in claim 3, wherein the thermal processing comprises rapid thermal processing (RTP).

5. The method for forming a semiconductor device as set forth in claim 3, wherein the thermal processing comprises a first rapid thermal processing (RTP) step, a wet etch, and a second RTP step.

6. The method for forming a semiconductor device as set forth in claim 1, wherein the forming of the first metal layer includes directing metal particles toward the non-planar topography polysilicon layer at an angle of incidence that is not equal to an angle of incidence at which metal particles are directed toward the non-planar topography polysilicon layer during formation of the second metal layer.

7. A method for forming a semiconductor device, comprising:
    forming a featured polysilicon layer on a substrate;
    forming a first metal layer on the featured polysilicon layer, the first metal layer covering lateral surfaces of the featured polysilicon layer to a greater extent than vertical surfaces;
    forming a second metal layer over the featured polysilicon layer, the second metal layer covering vertical surfaces of the featured polysilicon layer to a greater extent than a coverage of vertical surfaces by the first metal layer, an angle of incidence at which metal particles are directed toward the featured polysilicon layer being different for the forming of the second metal layer than for the forming of the first metal layer; and
    performing thermal processing to generate a metal silicide layer.

8. The method for forming a semiconductor device as set forth in claim 7, wherein the thermal processing comprises a first rapid thermal processing (RTP) step, a wet etch, and a second RTP step.

9. A method for forming a semiconductor device, comprising:
    forming a featured polysilicon layer on a substrate;
    forming a first metal layer on the featured polysilicon layer;
    performing thermal processing to generate a first metal silicide layer within the first metal layer, the first metal silicide layer having a greater bottom coverage than a sidewall coverage;
    forming a second metal layer over the featured polysilicon layer, whereby during formation of the second metal layer metal particles are directed at a different angle of incidence than during formation of the first metal layer; and
    performing thermal processing to generate a second metal silicide layer, which has a greater sidewall coverage than a sidewall coverage of the first metal silicide layer.

10. The method for forming a semiconductor device as set forth in claim 9, wherein:
    the forming of the first metal layer occurs before the forming of the second metal layer; and
    the forming of the first metal silicide layer occurs substantially simultaneously with the forming of the second metal silicide layer.

11. The method for forming a semiconductor device as set forth in claim 10, wherein:
    the first metal silicide layer and the second metal silicide layer are integrally formed together; and
    the method further comprises subsequent steps of (i) performing a wet etch and (ii) performing another thermal processing step on the integrally formed first metal silicide layer and second metal silicide layer.

12. A method for forming a semiconductor device, comprising:
    forming on a substrate a polysilicon layer having a non-planar topography;
    forming a first metal layer on the non-planar topography polysilicon, the forming of the first metal layer including directing metal particles toward the non-planar topography polysilicon layer at a first angle of incidence;
    forming a second metal layer over the non-planar topography polysilicon layer, the forming of the second metal layer including directing metal particles toward the non-planar topography polysilicon at a second angle of incidence, which is not equal to the first angle of incidence; and
    performing thermal processing to generate a metal silicide layer.

13. The method for forming a semiconductor device as set forth in claim 12, wherein the thermal processing comprises a first rapid thermal processing (RTP) step, a wet etch, and a second RTP step.

14. The method for forming a semiconductor device as set forth in claim 12, wherein the forming of a first metal layer includes a biased ionized metal plasma physical vapor deposition (IMP PVD).

15. The method for forming a semiconductor device as set forth in claim 14, wherein the forming of the second metal layer includes a an unbiased ionized metal plasma physical vapor deposition (IMP PVD).

16. The method for forming a semiconductor device as set forth in claim 12, wherein the forming of the first metal layer includes a collimated deposition.

17. The method for forming a semiconductor device as set forth in claim 12, wherein the forming of the second metal layer includes an unbiased ionized metal plasma physical vapor deposition (IMP PVD).

18. The method for forming a semiconductor device as set forth in claim 12, wherein the forming of the second metal layer includes a physical vapor deposition (PVD).

19. The method for forming a semiconductor device as set forth in claim 12, wherein the forming of one of the first metal layer and the second metal layer includes a chemical vapor deposition (CVD).

20. The method for forming a semiconductor device as set forth in claim 12, wherein the forming of the first metal layer includes depositing a metal, the metal being selected from a group consisting of Titanium (Ti), Cobalt (Co), and Nickel (Ni).

* * * * *